United States Patent
Kuppurao et al.

(10) Patent No.: US 8,728,944 B2
(45) Date of Patent: May 20, 2014

(54) METHOD OF REMOVING CONTAMINANTS AND NATIVE OXIDES FROM A SUBSTRATE SURFACE

(75) Inventors: Satheesh Kuppurao, San Jose, CA (US); Manish Hemkar, Sunnyvale, CA (US); Vinh Tran, San Jose, CA (US); Yihwan Kim, San Jose, CA (US)

(73) Assignee: Applied Material, Inc., Santa Clara, CA (US)

( * ) Notice: Subject to any disclaimer, the term of this patent is extended or adjusted under 35 U.S.C. 154(b) by 9 days.

(21) Appl. No.: 13/177,409

(22) Filed: Jul. 6, 2011

(65) Prior Publication Data

US 2012/0034761 A1 Feb. 9, 2012

Related U.S. Application Data

(60) Provisional application No. 61/370,722, filed on Aug. 4, 2010.

(51) Int. Cl.
 *H01L 21/311* (2006.01)

(52) U.S. Cl.
 USPC ......................................................... 438/694

(58) Field of Classification Search
 USPC ................ 438/694, 695, 723; 134/4
 See application file for complete search history.

(56) References Cited

U.S. PATENT DOCUMENTS

| | | | |
|---|---|---|---|
| 3,969,164 A | 7/1976 | Cho et al. | |
| 5,470,799 A | 11/1995 | Itoh et al. | |
| 5,674,357 A | 10/1997 | Sun et al. | |
| 5,849,649 A | 12/1998 | Poole | |
| 6,319,331 B1 | 11/2001 | Kume et al. | |
| 6,562,707 B2 * | 5/2003 | Ryu et al. | 438/585 |
| 7,562,662 B2 * | 7/2009 | Kim et al. | 134/1.2 |
| 7,611,973 B2 * | 11/2009 | Shin et al. | 438/478 |
| 2004/0171236 A1 * | 9/2004 | Shih et al. | 438/478 |
| 2006/0057853 A1 | 3/2006 | Mehrotra et al. | |
| 2007/0087506 A1 | 4/2007 | Thakur | |

OTHER PUBLICATIONS

International Search Report and Written Opinion dated Feb. 29, 2012 for International Application No. PCT/US2011/043073.
Scanning Tunneling Microscopy Study of Cleaning Procedures for SiGe (001) Surfaces, D.E. Jones et al., Surface Science 341 (1995), L1005-L1010.
Low Temperature Surface Cleaning fo Silicon and Its Application to Silicon MBE, Ishizaka et al., Electrochemical Science and Technology, Apr. 1986, pp. 666-671.

* cited by examiner

*Primary Examiner* — Reema Patel
(74) *Attorney, Agent, or Firm* — Patterson & Sheridan, LLP (57) ABSTRACT

Embodiments of the present invention generally relate to methods for removing contaminants and native oxides from substrate surfaces. The methods generally include exposing a substrate having an oxide layer thereon to an oxidizing source. The oxidizing source oxidizes an upper portion of the substrate beneath the oxide layer to form an oxide layer having an increased thickness. The oxide layer with the increased thickness is then removed to expose a clean surface of the substrate. The removal of the oxide layer generally includes removal of contaminants present in and on the oxide layer, especially those contaminants present at the interface of the oxide layer and the substrate. An epitaxial layer may then be formed on the clean surface of the substrate.

18 Claims, 6 Drawing Sheets

METHOD OF REMOVING CONTAMINANTS AND NATIVE OXIDES FROM A SUBSTRATE SURFACE

CROSS-REFERENCE TO RELATED APPLICATIONS

This application claims benefit of U.S. Provisional Patent Application Ser. No. 61/370,722, filed Aug. 4, 2010, which is herein incorporated by reference.

BACKGROUND OF THE INVENTION

1. Field of the Invention

Embodiments of the present invention generally relate to removing native oxides and contaminants from a semiconductor substrate surface.

2. Description of the Related Art

Integrated circuits are formed in and on silicon and other semiconductor substrates. In the case of monocrystalline silicon, substrates are made by growing an ingot from a bath of molten silicon, and then sawing the solidified ingot into multiple wafers. An epitaxial silicon layer may then be formed on the monocrystalline silicon wafer to form a defect free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical ambient conditions. For example, a native oxide layer may form on the monocrystalline silicon surface prior to deposition of the epitaxial layer. Additionally, contaminants present in the ambient environment may deposit on the monocrystalline surface. The presence of a native oxide layer or contaminants on the monocrystalline silicon surface negatively affects the quality of an epitaxial layer subsequently formed on the monocrystalline surface. While present cleaning methods remove some of the native oxides and contaminants from the monocrystalline silicon surface, some contaminants still remain.

Therefore, there is a need for a more effective way of removing native oxides and contaminants from a substrate surface.

SUMMARY OF THE INVENTION

Embodiments of the present invention generally relate to methods for removing contaminants and native oxides from substrate surfaces. The methods generally include exposing a substrate having an oxide layer thereon to an oxidizing source. The oxidizing source oxidizes an upper portion of the substrate beneath the oxide layer to form an oxide layer having an increased thickness. The oxide layer with the increased thickness is then removed to expose a clean surface of the substrate. The removal of the oxide layer generally includes removal of contaminants present in and on the oxide layer, especially those contaminants present at the interface of the oxide layer and the substrate. An epitaxial layer may then be formed on the clean surface of the substrate.

In one embodiment, a method of cleaning a substrate surface comprises positioning a substrate in a chamber. The substrate has an oxide layer thereon, and the oxide layer has a first thickness. The thickness of the oxide layer is increased to a second thickness by exposing the substrate to an oxidizing source. The oxide layer is removed from the substrate, and a material layer is deposited on the substrate after removing the oxide layer.

In another embodiment, a method of cleaning a substrate includes positioning a substrate having an oxide layer thereon in a first chamber. The substrate has a contaminant at the interface between the substrate and the oxide layer. The thickness of the oxide layer is increased by exposing the substrate to an oxidizing source to oxidize an upper portion of the substrate and to extend the oxide layer to a depth below the contaminant. The oxide layer and the contaminant are then removed from the substrate.

In another embodiment, a method of cleaning a substrate includes positioning a substrate in a first chamber. The substrate comprises monocrystalline silicon having a native oxide layer thereon. The native oxide layer has a first thickness. The thickness of the native oxide layer is increased by exposing the substrate to an oxidizing source selected form the group consisting of oxygen, ozone, and steam. The substrate is positioned in a second chamber, and the oxide layer is removed from the substrate during a thermal process. An epitaxial layer is then formed on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for removing contaminants and native oxides from substrate surfaces. The methods generally include exposing a substrate having an oxide layer thereon to an oxidizing source. The oxidizing source oxidizes an upper portion of the substrate beneath the oxide layer to form an oxide layer having an increased thickness. The oxide layer with the increased thickness is then removed to expose a clean surface of the substrate. The removal of the oxide layer generally includes removal of contaminants present in and on the oxide layer, especially those contaminants present at the interface of the oxide layer and the substrate. An epitaxial layer may then be formed on the clean surface of the substrate.

Embodiments of the present invention may be advantageously practiced in a semiconductor cleaning chamber, such as the SiCoNi™ Preclean chamber, available from Applied Materials, Inc. of Santa Clara, Calif. Chambers available from other manufacturers may also be used to practice embodiments described herein.

Figure 1:
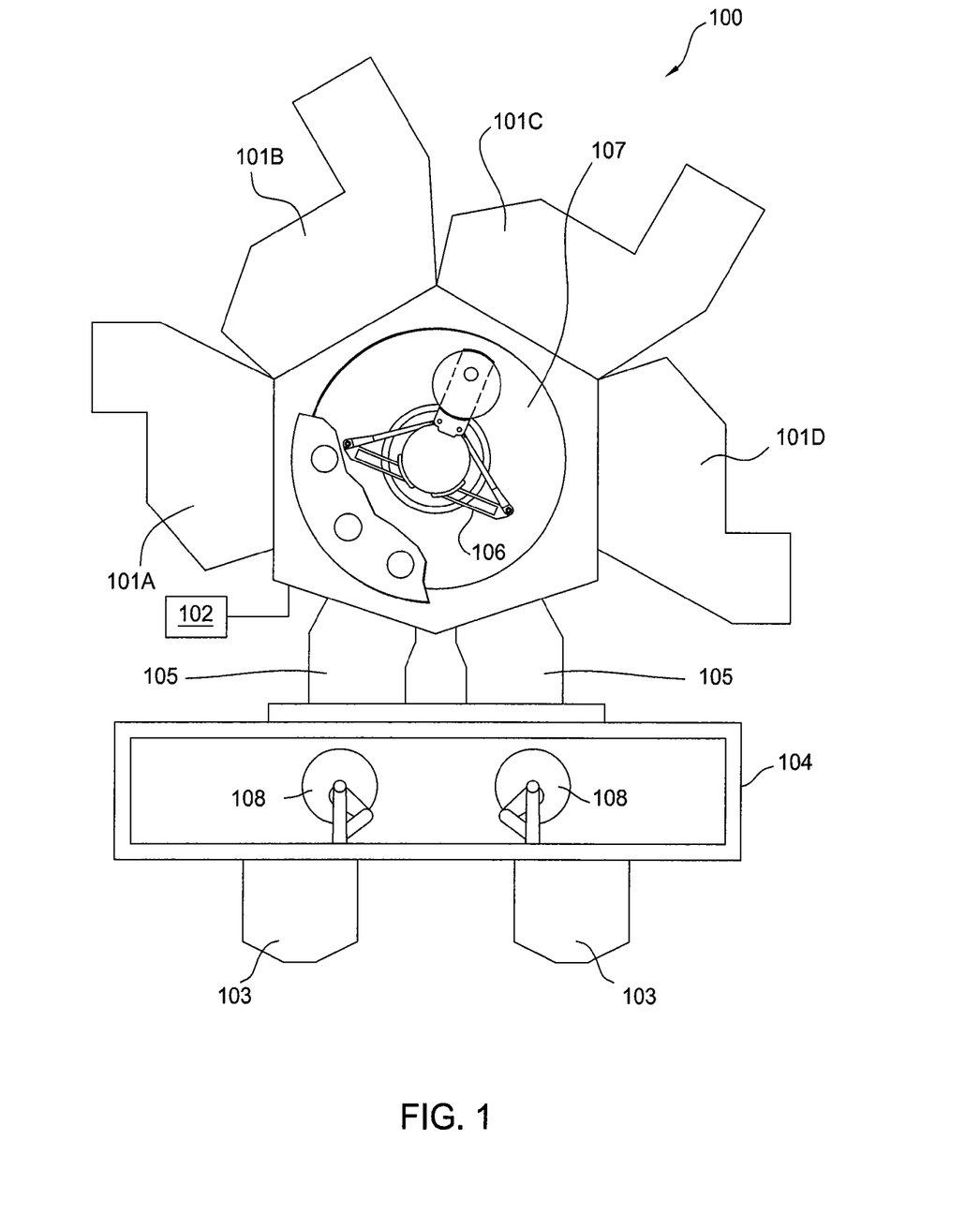
FIG. 1 illustrates a plan view of a cluster tool for semiconductor processing.

FIG. 1 illustrates a plan view of a cluster tool 100 for semiconductor processing. A cluster tool 100 is a modular system comprising multiple chambers which perform various functions in a semiconductor fabrication process. The cluster tool 100 comprises a central transfer chamber 107 connected to a front end environment 104 via a pair of load locks 105. Factory interface robots 108 are disposed in the front end environment 104 and are configured to shuttle substrates between the load locks 105 and a plurality of pods 103 mounted on the front end environment 104. A controller 102 is coupled to the central transfer chamber 107. The controller 102 contains a computer-readable medium and is adapted to execute one or more programs for processing substrates according to methods described herein.

A plurality of chambers 101A-D are mounted to the central transfer chamber 107 for performing a desired process. A central robot 106 disposed in the central transfer chamber 107 is configured to transfer substrates between the load locks 105 and the plurality of chambers 101A-D, or among the plurality of chambers 101A-D. The plurality of chambers 101A-D may comprise any combination of one or more of a cleaning chamber, an implant chamber, an anneal chamber, an etching chamber, or a deposition chamber. For example, chambers 101A and 101B may be cleaning chambers, while chambers 101C and 101D may be deposition chambers adapted to grow or deposit epitaxial layers on semiconductor substrates. In one embodiment, a first cleaning chamber having an oxidizing source coupled thereto, a second cleaning chamber adapted to perform a dry etch process, and an epitaxial deposition chamber are coupled to the central transfer chamber 107.

Figure 2:
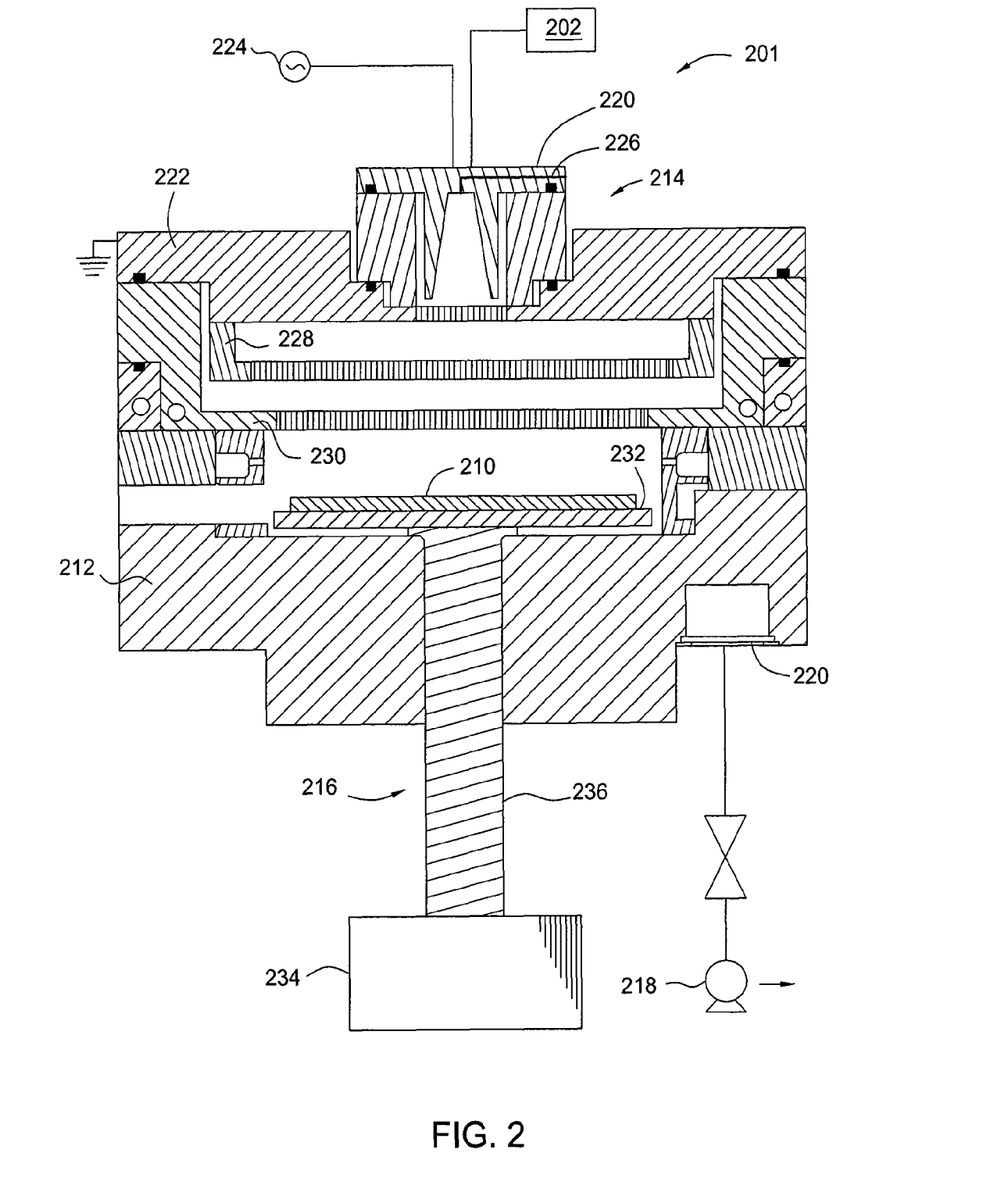
FIG. 2 is a schematic cross-sectional view of a cleaning chamber.

FIG. 2 is a schematic cross-sectional view of a cleaning chamber. The chamber 201 may be particularly useful for performing a thermal or plasma-based oxidation process and/or a plasma assisted dry etch process. The chamber 201 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from chamber 201. The vacuum system includes a vacuum pump 218 coupled to a vacuum port 221 disposed in the chamber body 212.

The lid assembly 214 includes at least two stacked components configured to form a plasma volume or cavity therebetween. A first electrode 220 is disposed vertically above a second electrode 222 confining a plasma volume. The first electrode 220 is connected to a power source 224, such as a radio frequency (RF) power supply, and the second electrode 222 is connected to ground or a source return, forming a capacitance between the first electrode 220 and the second electrode 222. The lid assembly 214 also includes one or more gas inlets 226 for providing a cleaning gas to a substrate surface through blocker plate 228 and gas distribution plate 230. The cleaning gas may be an etchant or ionized active radical, such as ionized fluorine or chlorine, or an oxidizing agent, such as ozone. Additionally, the chamber 201 includes a controller 202 for controlling processes within the chamber 201.

The support assembly 216 may include a substrate support 232 to support a substrate 210 thereon during processing. The substrate support 232 may be coupled to an actuator 234 by a shaft 236 which extends through a centrally-located opening formed in a bottom surface of the chamber body 212. The actuator 234 may be flexibly sealed to the chamber body 212 by bellows (not shown) that prevent vacuum leakage from around the shaft 236. The actuator 234 allows the substrate support 232 to be moved vertically within the chamber body 212 between a process position and a lower, transfer position. The transfer position is slightly below the opening of a slit valve formed in a sidewall of the chamber body 212.

The substrate support 232 has a flat, or a substantially flat, surface for supporting a substrate to be processed thereon. The substrate support 232 may be moved vertically within the chamber body 212 by actuator 234 coupled thereto by shaft 236. In operation, the substrate support 232 may be elevated to a position in close proximity to the lid assembly 214 to control the temperature of the substrate 210 being processed. As such, the substrate 210 may be heated via radiation emitted or convection from the distribution plate 230.

Figure 3A:
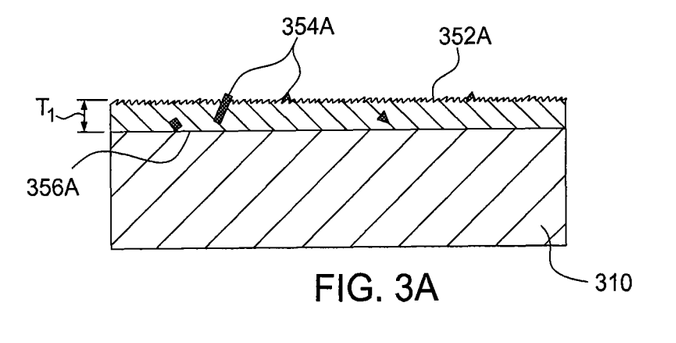
FIGS. 3A-3D are schematic views of semiconductor substrates according to one embodiment.

FIGS. 3A-3D are schematic views of semiconductor substrates according to one embodiment. FIG. 3A illustrates a substrate 310 having oxide layer 352A with a first thickness $T_1$ disposed thereon. Typical substrates include silicon, germanium and group III-V compounds such as gallium arsenide, gallium phosphide, and gallium nitride. In one embodiment, substrate 310 may be a semiconductor substrate, such as silicon, and oxide layer 352A may be a native oxide layer, such as silicon dioxide. Substrate 310 may also contain impurities or contaminants 354A. Generally, contaminants 354A are deposited on the surface of substrate 310 when substrate 310 is transferred between processing equipment, or when substrate 310 is transferred to a processing chamber having contaminants therein. However, contaminants 354A can be introduced to substrate 310 in other places and in other manners as well. Contaminants as used herein may include any undesirable material, such as particulate matter or atoms, which may negatively or undesirably affect substrate processing. For example, contaminants 354A may include boron, nitrogen, fluorine or chlorine atoms which are present in the atmosphere around substrate 310 and are undesirably embedded in substrate 310 prior to processing. Contaminants 354A may contact the surface of the substrate 310 or the oxide layer 352A and diffuse or embed into the oxide layer 352A. Additionally or alternatively, contaminants 354A could contact the surface of substrate 310 and the oxide layer 352A could form around and/or over contaminants 354A. Contaminants may be located within oxide layer 352A, at the substrate/oxide layer interface 356A, or even slightly below interface 356A and partially embedded in substrate 310.

Figure 3B:
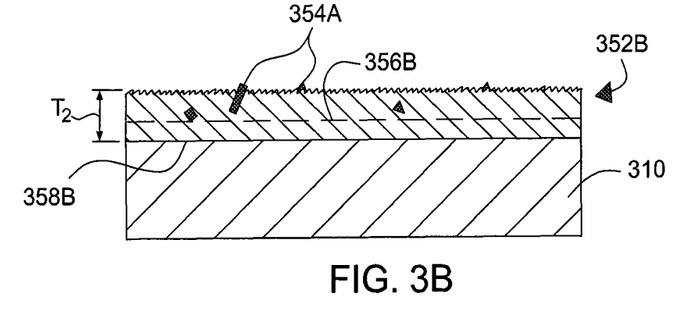

In FIG. 3B, substrate 310 has an oxide layer 352B having a second thickness $T_2$ disposed thereon. The thickness of oxide layer 352A has been extended down to a second interface 358B, thus forming oxide layer 352B having a thickness $T_2$. In the embodiment shown in FIG. 3B, the substrate 310 has been exposed to an oxidizing source, such as an oxidizing gas, to oxidize additional material of substrate 310 between the first interface 356B and the second interface 358B. By exposing the upper portion of substrate 310 to an oxidizing gas, the substrate/oxide layer interface has been extended or moved from a first interface 356B to a second interface 358B, sacrificially oxidizing an upper portion of substrate 310.

The first interface 356B represents the interface between substrate 310 and oxide layer 352A prior to oxidizing an upper portion of substrate 310. The second interface 358B represents the interface between oxide layer 352B and the underlying (non-oxidized) substrate surface. It is to be understood that oxide layer 352B is the same as oxide layer 352A having an increased thickness. For explanatory purposes, oxide layer 352B will be referred to as being formed when the upper portion of substrate 310 is oxidized. However, the formation of oxide layer 352B is equivalent to increasing the thickness of oxide layer 352A. Thus, oxide layer 352B is not a separate layer in addition to oxide layer 352A; rather, oxide layer 352B represents oxide layer 352A having an increased depth or thickness.

By increasing or extending the oxide layer 352A to a second interface 358B to form oxide layer 352B, the oxide layer 352B envelops the upper surface of substrate 310, including the contaminants 354A. Thus, the oxide layer 352B includes the contaminants 354A found at the first interface 356B, as well as the contaminants found within the first few angstroms of the upper portion of substrate 310 prior to forming oxide layer 352B. The oxide layer 352B generally has a thickness $T_2$ of about 8 angstroms or greater, such as about 8 angstroms to about 25 angstroms. Preferably, the oxide layer 352B has a thickness $T_2$ of about 15 angstroms to about 25 angstroms, for example, about 15 angstroms. In one embodiment, the oxide layer 352B may have a thickness $T_2$ of about 25 angstroms or greater. When processing multiple substrates, such as in the cluster tool of FIG. 1, the oxidation of multiple substrate surfaces from the first interface 356B to the second interface 358B can be consistently reproduced using a set process recipe.

Suitable oxidizing sources for increasing the thickness of oxide layer 352A to form oxide layer 352B having thickness $T_2$ include oxygen, ozone, in situ or ex situ steam, or any other oxidizing agent which does not introduce additional contaminants to the surface of substrate 310. A plurality of oxidizing methods and chambers are available to form oxide layer 352B by sacrificially oxidizing the upper portion of substrate 310. For example, an Applied Radox™ RTP chamber, available from Applied Materials, Inc. of Santa Clara, Calif., may be used to form oxide layer 352B using radical oxygen in a thermal environment. The substrate 310 may be heated to a temperature less than about 1100 degrees Celsius while increasing the thickness of the oxide layer 352A to the second interface 358B thus forming oxide layer 352B. In one embodiment, the temperature of the substrate 310 may be between about 625 degrees Celsius and 900 degrees Celsius.

The upper portion of substrate 310 can also be oxidized to form oxide layer 352B using a low-temperature oxidation process, such as a decoupled plasma oxidation process. A decoupled plasma oxidization process uses ionized gas or plasma to increase the thickness of oxide layer 352A. The decoupled plasma oxidation process can be performed while maintaining the substrate 310 at about 25 degrees Celsius. It is preferable to oxidize the substrate 310 using a low-temperature process so that the overall thermal budget of the substrate 310 is reduced. Exposing substrate 310 to high-temperature processes for extended periods of time (high thermal budget) can cause damage to the substrate 310 and degrade final device performance. Therefore, it is preferable to reduce the overall thermal budget by using low-temperature processes, when available.

Figure 3C:
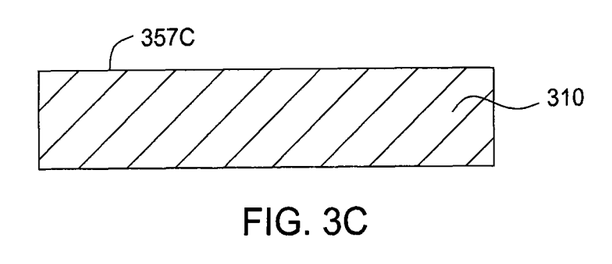

In FIG. 3C, the oxide layer 352B has been removed from substrate 310. Since the oxide layer 352B extended to a second interface 358B, when the oxide layer 352B was removed, the contaminants above the second interface 358B were also removed. If the thickness of the oxide layer 352A had not been extended to the second interface 358B to form oxide layer 352B, contaminants which were located between the first interface 356B and the second interface 358B would still remain on substrate 310 after removal of oxide layer 352A. Thus, more contaminants can be removed from the surface of substrate 310 by further oxidizing an existing oxide layer from a thickness $T_1$ to an increased thickness $T_2$, and then removing the oxide layer. In contrast, if the thickness of oxide layer 352A is not increased, a greater amount of contaminants could remain on substrate 310 subsequent to the removal of oxide layer 352A. The removal of the oxide layer 352B having thickness $T_2$ leaves the substrate surface 357C with substantially less contaminants thereon, since contaminants present in the sacrificial upper portion of substrate 310 are also removed. The reduction in contaminants improves the quality of subsequently deposited films, as well as deposition rate and overall final device performance.

Figure 3D:
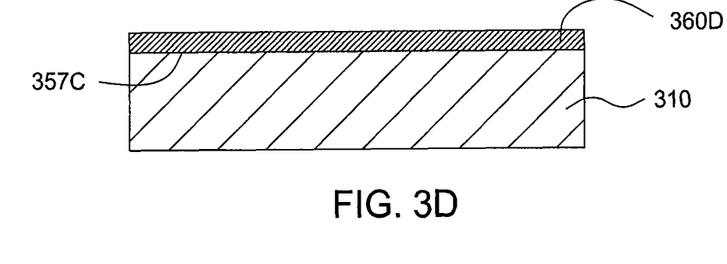

In FIG. 3D, an epitaxial layer 360D is subsequently deposited on the substrate surface 357C of substrate 310, creating an interface therebetween. The substrate surface 357C has a reduced number of contaminants and is substantially oxide free. Since substrate surface 357C has a reduced number of contaminants thereon, epitaxial layer 360D can more easily and more uniformly be grown or deposited on substrate 310. In one embodiment, the epitaxial layer 360D is a silicon epitaxial layer, a silicon-germanium epitaxial layer, or a silicon-carbon epitaxial layer. In another embodiment, the epitaxial layer comprises a dopant, such as boron or phosphorus.

Figure 4:
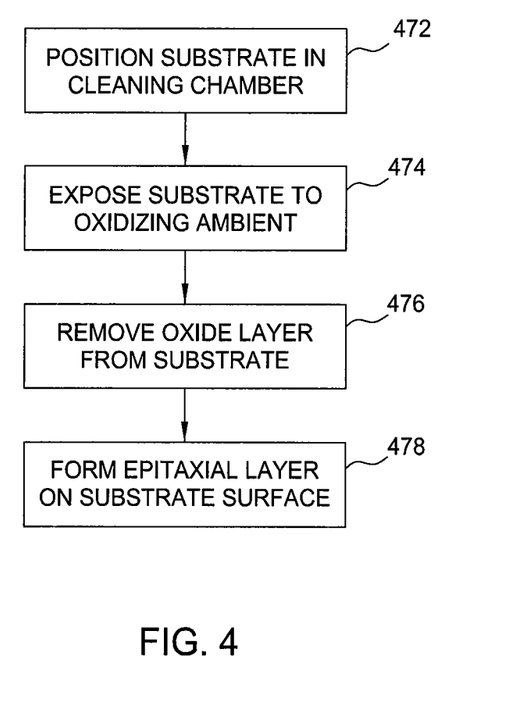
FIG. 4 is a flow chart of a method for cleaning a semiconductor substrate.

FIG. 4 is a flow chart of a method for cleaning a semiconductor substrate. In operation 472, a substrate having an oxide layer thereon is positioned in a substrate cleaning chamber. In one embodiment, the cleaning chamber is a stand-alone chamber which does not share a central transfer chamber with other process chambers. In operation 474, the thickness of the oxide layer is increased by exposing the substrate to an oxidizing source within the cleaning chamber, and oxidizing an upper portion of the substrate beneath the oxide layer. The thickness of the oxide layer disposed on the substrate is increased by sacrificially oxidizing an upper portion of the substrate immediately below the existing oxide layer. Preferably, the thickness of the oxide layer is increased to a point beyond the majority of the contaminants found at the first substrate/oxide layer interface.

In operation 476, the oxide layer having an increased thickness is removed from the surface of the substrate. The oxide layer may be removed in the same substrate cleaning chamber used in operation 472, or the substrate may be transferred to another chamber to remove the oxide layer. In one embodiment, the substrate may be transferred to a cluster tool which includes one or more cleaning chambers and an epitaxial deposition chamber. When the oxide layer is removed, most of the contaminants found in the oxide layer are removed, as well as any contaminants at the first substrate/oxide layer interface (the interface prior to increasing the oxide layer thickness), all the way to the depth of the second substrate/oxide layer interface (the interface subsequent to increasing the oxide layer thickness). Thus, the upper portion of the substrate surface can be sacrificially oxidized to a depth sufficient to remove a desired amount of contaminants. The removal of the oxide layer and the contaminants creates a cleaner substrate surface for subsequently depositing a material layer thereon in comparison to when the thickness of the oxide layer is not increased. In operation 478, the substrate is transferred to a deposition chamber and an epitaxial layer is grown or formed on the substrate surface from which the oxide layer and contaminants have been removed.

Figure 5A:
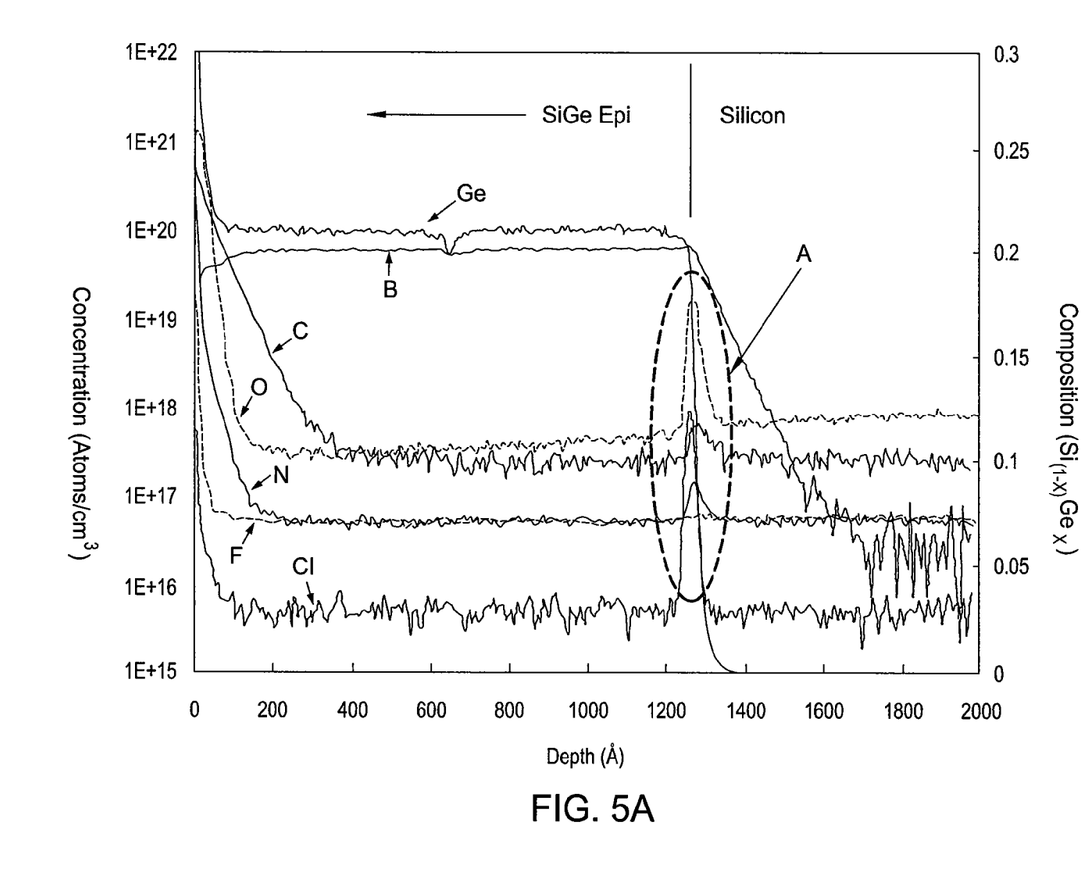
FIGS. 5A-5C are charts illustrating interfacial contamination of silicon substrates and epitaxial layers formed thereon.
Figure 5B:
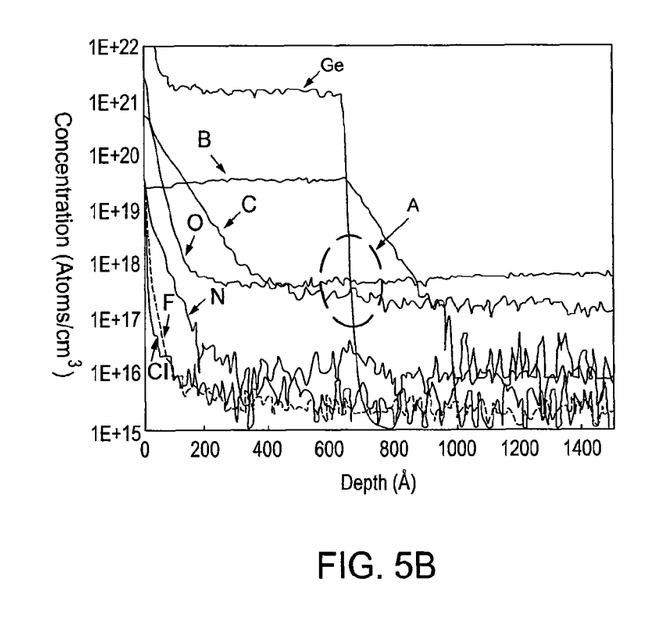
Figure 5C:
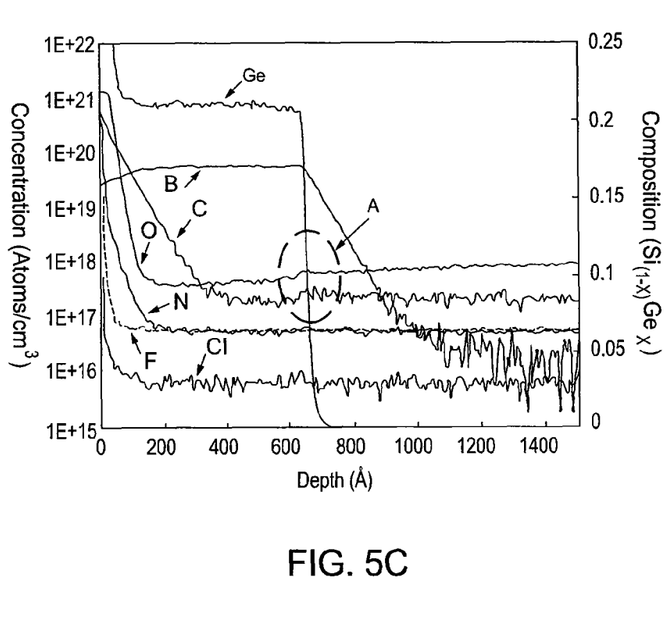

FIGS. 5A-5C are charts illustrating interfacial contamination of silicon substrates and epitaxial layers formed thereon. In FIG. 5A, a silicon substrate having a native oxide layer thereon was cleaned using an ionized active radical etch. Subsequently, a silicon-germanium epitaxial layer was grown thereon at approximately 700 degrees Celsius. The steep decline of germanium indicates the interface A between the silicon substrate and the epitaxial layer. At the interface A, a silicon-germanium epitaxial layer containing about 22.2 percent germanium was grown on a silicon substrate. The concentration of chlorine, nitrogen, fluorine, carbon, oxygen, and boron atoms per cubic centimeter are illustrated, as measured by secondary ion mass spectrometry.

The concentration of chlorine atoms in the silicon substrate and in the epitaxial layer is about $5 \times 10^{15}$ atoms per cubic centimeter. However, at the interface A between the silicon substrate and the epitaxial layer, the chlorine atom concentration is about $1 \times 10^{18}$ atoms per cubic centimeter. The concentration of nitrogen and fluorine within the silicon substrate and within the epitaxial layer is about $6 \times 10^{16}$ atoms per cubic centimeter. The concentration of nitrogen and fluorine at the interface is about $1 \times 10^{17}$ atoms per cubic centimeter. The concentration of carbon within the silicon substrate and within the epitaxial layer is about $2 \times 10^{17}$ atoms per cubic centimeter, while the concentration of carbon at the interface A is about $8 \times 10^{17}$ atoms per cubic centimeter.

The concentration of oxygen within the silicon substrate is about $5 \times 10^{17}$ atoms per cubic centimeter, while the concentration of oxygen in the epitaxial layer is about $3 \times 10^{17}$ atoms per cubic centimeter. At the interface A, the concentration of oxygen is about $1 \times 10^{19}$ atoms per cubic centimeter. The epitaxial layer has been doped to a boron concentration of about $5 \times 10^{19}$ atoms per cubic centimeter, while the boron concentration within the silicon substrate has a tapering boron concentration due to diffusion from the boron-doped epitaxial layer into the silicon substrate. For the atoms shown, the interfacial concentration of each atom is greater than the concentration within of the silicon substrate or within the epitaxial layer, as illustrated by the concentration peaks at the interface A.

In FIG. 5B, a silicon substrate having a native oxide layer thereon was cleaned using an ionized active radical etch. Prior to the ionized active radical etch, the silicon substrate was raised to a temperature of about 650 degrees Celsius and exposed to radical oxygen in an Applied Radox™ RTP chamber, available from Applied Materials, Inc. of Santa Clara, Calif. The thickness of the native oxide layer was increased to about 15 angstroms. The substrate was transferred to a cleaning chamber, and the oxide layer was etched from the substrate. The substrate was then transferred to a deposition chamber, and a boron-doped silicon-germanium epitaxial layer was grown thereon at approximately 700 degrees Celsius. The silicon-germanium epitaxial layer contained about 22.0 percent germanium. The concentration of chlorine, nitrogen, fluorine, carbon, oxygen, and boron atoms per cubic centimeter are illustrated, as measured by secondary ion mass spectrometry.

The concentrations of chlorine and fluorine atoms in the silicon substrate and in the epitaxial layer have an average concentration of about $3 \times 10^{15}$ atoms per cubic centimeter. At the interface A between the silicon substrate and the epitaxial layer, the chlorine atom concentration is about $6 \times 10^{15}$ atoms per cubic centimeter, and the fluorine atom concentration is about $2 \times 10^{15}$ atoms per cubic centimeter. The concentration of nitrogen within the silicon substrate and within the epitaxial layer is about $1 \times 10^{16}$ atoms per cubic centimeter. The concentration of nitrogen at the interface is about $2 \times 10^{16}$ atoms per cubic centimeter. The concentration of carbon within the silicon substrate and within the epitaxial layer near the interface is about $1 \times 10^{17}$ atoms per cubic centimeter, which is approximately equal to the concentration of carbon at the interface A.

The concentration of oxygen within the silicon substrate is about $5 \times 10^{17}$ atoms per cubic centimeter, which is approximately equal to the concentration of oxygen at the interface A. The epitaxial layer has been doped to a boron concentration of about $4 \times 10^{19}$ atoms per cubic centimeter, while the boron concentration within the silicon substrate has a tapering boron concentration due to diffusion from the boron-doped epitaxial layer into the silicon substrate. Comparing FIG. 5B to 5A, FIG. 5B lacks the atom concentration peaks found at interface A of FIG. 5A. It is believed that the sacrificial oxidation of the upper portion of the substrate assists in removing a greater amount of atoms which contribute to the interfacial contamination at interface A. Thus, oxidation of the upper portion of the substrate and removal of the increased-thickness oxide layer results in a cleaner substrate surface having less interfacial contamination, as illustrated in FIG. 5B.

In FIG. 5C, a silicon substrate having a native oxide layer thereon was cleaned using an ionized active radical etch. Prior to the ionized active radical etch, the upper portion of the silicon substrate was oxidized at room temperature by exposure to an oxidizing plasma in an oxidizing chamber. The upper portion of the substrate was oxidized to increase the thickness of the native oxide layer to a depth of about 15 angstroms. The substrate was transferred to a cleaning chamber, and the oxide layer was etched from the substrate. The substrate was then transferred to a deposition chamber, and a boron-doped silicon-germanium epitaxial layer was grown thereon at approximately 700 degrees Celsius. The silicon-germanium epitaxial layer contained about 20.9 percent germanium. The concentration of chlorine, nitrogen, fluorine, carbon, oxygen, and boron atoms per cubic centimeter are illustrated, as measured by secondary ion mass spectrometry.

The concentration of chlorine atoms in the silicon substrate and in the epitaxial layer is about $7 \times 10^{15}$ atoms per cubic centimeter, which is approximately equal to the concentration of chlorine atoms at the interface A. The concentrations of nitrogen and fluorine atoms within the silicon substrate and within the epitaxial layer are about $7 \times 10^{16}$ atoms per cubic centimeter, which is approximately equal to the concentrations of nitrogen and fluorine atoms at the interface A. The concentration of carbon within the silicon substrate and within the epitaxial layer is about $2 \times 10^{17}$ atoms per cubic centimeter. The concentration of carbon at the interface A is about $3 \times 10^{17}$ atoms per cubic centimeter.

The concentration of oxygen within the silicon substrate is about $8 \times 10^{17}$ atoms per cubic centimeter. The concentration of oxygen within the epitaxial layer is about $4 \times 10^{17}$ atoms per cubic centimeter. The concentration of oxygen at the interface A is about $7 \times 10^{17}$ atoms per cubic centimeter. The epitaxial layer has been doped to a boron concentration of about $5 \times 10^{19}$ atoms per cubic centimeter, while the boron concentration within the silicon substrate has a tapering boron concentration due to diffusion from the boron-doped epitaxial layer into the silicon substrate.

As FIG. 5C illustrates, interfacial contamination can be reduced by further oxidizing an existing oxide layer on a substrate to an increased depth prior to removal of the oxide layer. By sacrificially oxidizing a portion of the substrate surface beneath an existing oxide layer, the existing oxide layer and the oxidized upper surface of the substrate can be removed in a cleaning process, thus removing a greater amount of contaminants from the surface of the substrate. As explained above, a relatively high concentration of contaminants can be found at the substrate/oxide layer interface. The increase in oxide layer thickness increases the amount of material to be removed from the substrate during a cleaning process. Preferably, the oxide layer thickness is increased enough to encompass the interfacial contamination, which is then removed with the oxide layer when the oxide layer is removed from the surface of the substrate. Similar to FIG. 5B, further oxidation of an oxide layer by sacrificially oxidizing the upper portion of the substrate prior to oxide removal resulted in reduced interfacial contamination. The reduction in interfacial contamination is illustrated in FIG. 5C by the relatively level atom concentrations at the interface A, e.g., the lack of concentration peaks at the interface.

Benefits of the present invention include increased removal of contaminants from substrate surfaces prior to deposition processes. The increased removal of contaminants results in cleaner substrate surfaces for use in subsequent processes. By increasing the thickness of the oxide layer present on the surface of a substrate prior to removing the oxide layer, a greater amount of material is removed form the surface of the substrate. The extra amount of material removed assists in removing interfacial contamination which may not otherwise be removed in conventional cleaning processes. The reduction in interfacial contamination allows for more uniform and higher quality epitaxial layers to be grown or formed on substrates, which increases the overall quality of the final manufactured device.

While the foregoing is directed to embodiments of the present invention, other and further embodiments of the invention may be devised without departing from the basic scope thereof, and the scope thereof is determined by the claims that follow.

We claim:

1. A method of cleaning a substrate surface, comprising:
   positioning a substrate in a chamber, the substrate having an oxide layer thereon, the oxide layer having a first thickness;
   increasing the thickness of the oxide layer to a second thickness by exposing the substrate to an oxidizing source;
   removing the oxide layer from the substrate; and
   depositing a material layer on the substrate after removing the oxide layer, wherein the removing the oxide layer further comprises removing a contaminant from the surface of the substrate.

2. The method of claim 1, wherein the oxidizing source is selected from the group consisting of oxygen, ozone, and steam.

3. The method of claim 2, further comprising positioning the substrate in a second chamber prior to the removing the oxide layer.

4. The method of claim 3, wherein the material layer is an epitaxial layer.

5. The method of claim 4, wherein the substrate comprises monocrystalline silicon and the oxide layer comprises silicon dioxide.

6. The method of claim 1, wherein the oxide layer is removed using a thermal process, a dry etch process, or a wet etch process.

7. The method of claim 1, wherein the second thickness is about 8 angstroms or greater.

8. The method of claim 7, wherein the second thickness is about 15 angstroms or greater.

9. The method of claim 8, wherein the second thickness is about 25 angstroms or greater.

10. The method of claim 1, wherein the increasing the thickness of the oxide layer occurs at a substrate temperature of less than about 1100 degrees Celsius.

11. The method of claim 10, wherein the increasing the thickness of the oxide layer occurs at a substrate temperature within a range from about 625 degrees Celsius to about 900 degrees Celsius.

12. The method of claim 10, wherein the increasing the thickness of the oxide layer occurs at a substrate temperature of about 25 degrees Celsius.

13. A method of cleaning a substrate surface, comprising:
    positioning a substrate having an oxide layer thereon in a first chamber, the substrate having a contaminant at the interface between the substrate and the oxide layer;
    increasing the thickness of the oxide layer by exposing the substrate to an oxidizing source to oxidize an upper portion of the substrate and to extend the oxide layer to a depth below the contaminant; and
    removing the oxide layer and the contaminant from the substrate.

14. The method of claim 13, wherein the substrate comprises monocrystalline silicon and the oxide layer comprises silicon dioxide.

15. The method of claim 13, wherein the oxide layer is removed using a thermal process, a dry etch process, or a wet etch process.

16. The method of claim 15, wherein the oxidizing source comprises oxygen, ozone, or steam.

17. The method of claim 13, further comprising depositing a silicon-germanium epitaxial layer on the substrate after removing the oxide layer.

18. A method of cleaning a substrate surface, comprising:
    positioning a substrate in a first chamber, the substrate comprising monocrystalline silicon having a native oxide layer thereon, the native oxide layer having a first thickness;
    increasing the thickness of the native oxide layer by exposing the substrate to an oxidizing source selected from the group consisting of oxygen, ozone, and steam;
    positioning the substrate in a second chamber;
    removing the oxide layer from the substrate during a thermal process; and
    forming an epitaxial layer on the substrate, wherein the removing the oxide layer further comprises removing a contaminant from a surface of the substrate.

* * * * *